United States Patent [19]

Bean et al.

[11] Patent Number: 4,861,393

[45] Date of Patent: Aug. 29, 1989

[54] SEMICONDUCTOR HETEROSTRUCTURES HAVING $GE_xSI_{1-x}$ LAYERS ON SI UTILIZING MOLECULAR BEAM EPITAXY

[75] Inventors: John C. Bean, New Providence; Leonard C. Feldman, Berkeley Heights; Anthony T. Fiory, Summit, all of N.J.

[73] Assignee: American Telephone and Telegraph Company, AT&T Bell Laboratories, Murray Hill, N.J.

[21] Appl. No.: 57,679

[22] Filed: May 28, 1987

Related U.S. Application Data

[60] Continuation of Ser. No. 749,921, Jun. 28, 1985, abandoned, which is a division of Ser. No. 546,736, Oct. 28, 1983, Pat. No. 4,529,455.

[51] Int. Cl.$^4$ .................. H01L 29/165; H01L 31/06; H01L 21/203

[52] U.S. Cl. ........................... 148/33.4; 148/DIG. 25; 148/DIG. 59; 148/DIG. 67; 148/DIG. 72; 148/DIG. 169; 156/610; 156/612; 156/DIG. 64; 156/DIG. 67; 156/DIG. 103; 357/16; 437/106; 437/110; 437/131

[58] Field of Search ...... 148/33.4, DIG. 25, DIG. 59, 148/DIG. 67, DIG. 72, DIG. 169; 357/16; 437/106, 110, 131; 156/610, 611, 612, DIG. 64, DIG. 67, DIG. 103

[56] References Cited

U.S. PATENT DOCUMENTS

| | | | |
|---|---|---|---|
| 3,102,828 | 9/1963 | Courvoisier | 156/DIG. 67 |
| 3,242,018 | 3/1966 | Grabmaier et al. | 148/181 X |
| 3,275,906 | 9/1966 | Matsukura et al. | 148/DIG. 67 |
| 3,309,553 | 3/1967 | Kroemer | 148/DIG. 67 |
| 3,473,978 | 10/1969 | Jackson et al. | 148/175 |
| 3,615,855 | 10/1971 | Smith | 148/175 X |
| 3,984,857 | 10/1976 | Mason | 148/175 X |
| 3,993,533 | 11/1976 | Milnes et al. | 156/613 |
| 4,357,183 | 11/1982 | Fan et al. | 148/181 |

OTHER PUBLICATIONS

V. N. Vasilevskaya et al., "Structural Perfection of the Ge-Si and Si-Ge Heteroepitaxial Systems", *Thin Solid Films*, vol. 22, 1974, pp. 221-229.

E. Kasper et al., "A One-Dimensional SiGe Superlattice Grown by UHV Epitaxy", *Applied Physics*, vol. 8, 1975, pp. 199-205.

V. N. Vasilevskaja et al., "The Effect of Growth Conditions on the Structural and Electrical Properties of the Si-Ge Heteroepitaxial System", *Thin Solid Films*, vol. 30, 1975, pp. 91-98.

E. Kasper et al., "Elastic Strain and Misfit Dislocation Density in $Si_{0.92}Ge_{0.08}$ Films on Silicon Substrates", *Thin Solid Films*, vol. 44, 1977, pp. 357-370.

V. N. Vasilevskaya et al., "The Structure and Electrical Characteristics of Si/Ge Heterojunctions—I: Imperfections in the Si-Ge Heteroepitaxial System Obtained by Deposition of Germanium from a Molecular Beam", *Thin Solid Films*, vol. 55, 1978, pp. 229-234.

B. Y. Tsaur et al., "Heteroepitaxy of Vacuum--Evaporated Ge Films on Single-Crystal Si", *Applied Physics Letters*, vol. 38, No. 10, May 15, 1981, pp. 779-781.

M. Garozzo et al., "Heteroepitaxial Growth of Ge on <111> Si by Vacuum Evaporation", *Applied Physics Letters*, vol. 41, No. 11, Dec. 1, 1982, pp. 1070-1072.

J. C. Bean et al., "Silicon MBE Apparatus of Uniform High-Rate Deposition on Standard Format Wafers", *Journal of Vacuum Science Technology*, vol. 20, No. 2, Feb. 1982, pp. 137-142.

*Primary Examiner*—William G. Saba
*Attorney, Agent, or Firm*—Richard D. Laumann

[57] ABSTRACT

A molecular beam epitaxy method of growing $Ge_x$-$Si_{1-x}$ films on silicon substrate is described. Semiconductor heterostructures using $Ge_xSi_{1-x}$ layers grown on either Ge or Si substrates are described.

12 Claims, 2 Drawing Sheets

SEMICONDUCTOR HETEROSTRUCTURES HAVING GE$_x$SI$_{1-x}$ LAYERS ON SI UTILIZING MOLECULAR BEAM EPITAXY

This application is a continuation of application Ser. No. 749,921, filed June 28, 1985, now abandoned, which was a divisional application of application Ser. No. 546,736 filed on Oct. 28, 1983, now U.S. Pat. No. 4,529,455.

TECHNICAL FIELD

This invention relates generally to a method for growing heterostructures and particularly to a method for growing Ge/Si semiconductor heterostructures and to such heterostructures.

BACKGROUND OF THE INVENTION

The junction formed by the interface of two dissimilar semiconductors, which may have either the same or opposite conductivity types, is commonly termed a "heterojunction" and is useful in many types of devices. For example, the use of a heterojunction as an emitter base junction in a bipolar transistor was proposed by Schottky. Somewhat later, Kroemer proposed the use of a heterojunction as a wide bandgap emitter in a bipolar transistor. Many device uses for heterojunctions have been proposed since Kroemer's work including, for example, light sources, such as lasers and light emitting diodes, and photodetectors.

It is widely appreciated by the skilled artisan that useful devices may have more than one heterojunction. For example, double heterojunction lasers having an active layer sandwiched between two cladding layers are now widely used. Additionally, devices may have a plurality of thin layers of a first semiconductor composition interleaved with a plurality of thin layers of a second semiconductor composition. The resulting interleaved structure is commonly termed a "superlattice," and one type of superlattice structure is called a "quantum well laser." Such a structure arises when the active layer is of the order of the de Broglie wavelength, and two-dimensional quantization of the carrier energy levels occurs.

Heterojunctions between many different types of semiconductors have been fabricated and studied. For example, heterojunctions between AlGaAs and GaAs have been fabricated, with a second layer grown on a first layer, and are useful in many types of devices. This type of heterojunction is relatively easy to fabricate because as one varies the composition from pure GaAs to pure AlAs, the lattice constant of the semiconductor material does not vary very much. That is, for Al$_x$Ga$_{1-x}$As, the lattice constant is relatively constant as x varies. As a consequence, crystal perfection of the second layer is relatively easy to obtain. Matching of lattice constants, however, is not sufficient to ensure growth of good quality heterojunctions. For example, GaP and Si are approximately lattice matched, but GaP/Si heterojunctions are difficult to grow because these semiconductors may dope each other. Consequently, it is difficult to control the doping.

However, for many other materials systems of potential interest, the lattice constant of the second semiconductor layer differs significantly from that of the first semiconductor layer, and growth of a high-quality second layer is often difficult to obtain.

An example of a heterostructure having layers with significantly different lattice constants results from the growth of Ge or Ge$_x$Si$_{1-x}$, x greater than 0.0, layers on Si substrates or vice versa, that is, Si or Ge$_x$Si$_{1-x}$, x less than 1.0, layers on Ge substrates. Such heterostructures are not easy to fabricate because the lattice constants may differ by as much as 4 percent. While this constitutes a large lattice mismatch, it is less than that of such systems as silicon/sapphire in which the lattice constants differ by approximately 10 percent. Accordingly, much effort has been directed toward devising methods which would permit the growth of Ge/Si heterojunctions and more generally, the growth of Ge$_x$Si$_{1-x}$ films on Si for values of x greater than 0.0 and less than or equal to 1.0. However, no artisan has yet succeeded in growing smooth, defect-free, germanium-rich Ge$_x$Si$_{1-x}$ layers epitaxially on Si.

For example, *Thin Solid Films*, 22, pp. 221-229, 1974, describes the growth of germanium films on silicon substrates. The germanium films had what the authors termed a "fragmentary structure," which could be more accurately termed "cracked." High-quality films were not obtained. The authors used a relatively poor vacuum, 10$^{-6}$ Torr, and apparently little attention was devoted to substrate preparation prior to growth.

Another paper is in *Applied Physics*, 8, pp. 199-205, 1975, in which the growth of one-dimensional GeSi superlattices having periods varying between 100 and 800 Angstroms is described. The films contained only relatively small and varying amounts of germanium, that is, a multilayer structure comprising layers of Ge$_x$Si$_{1-x}$ was grown, and x never exceeded 0.15. Growth was at a substrate temperature of 750 degress C. Because of the lattice mismatch between the epitaxial layers having varying amounts of Ge, misfit dislocations were observed, and it was found that the number of such dislocations depended upon the thickness of the GeSi layers. It was further found that this relationship was in qualitative agreement with the theory of van de Merwe.

The effective growth conditions for GeSi films and, in particular, the cooling rate after film deposition, are discussed in *Thin Solid Films*, 30, pp. 91-98, 1975. A large number of fragmentary structures, that is, cracked layers, was observed, and the quality of the structures depended upon the cooling rate. A relatively poor vacuum was used as the authors apparently believed that variations in the vacuum quality between 10$^{-6}$ Torr and 10$^{-9}$ Torr had no effect upon layer quality.

The relationship between the elastic strain and misfit dislocation density in Ge$_{0.08}$Si$_{0.92}$ films on Si substrates is discussed in *Thin Solid Films*, 44, pp. 357-370, 1977. The authors grew films having only a small amount of Ge, that is, x equal to 0.08 at a substrate temperature of 750 degrees C., and found that the film strain was mainly compressive due to the lattice mismatch. They further found that below a critical film thickness there were no misfit dislocations, and above this critical thickness there were misfit dislocations which were generated to release the strain generated. The critical film thickness was 0.1 μm. The authors again concluded that their measured dependence of misfit dislocation distance on film thickness agreed with theoretical predictions. They also concluded that the critical film thickness was larger than predicted and that the films were not in an equilibrium state. Although the films were grown under ultra-high vacuum conditions, substrate cleaning and quality were apparently believed not critical.

A further study of imperfections in the $Ge_xSi_{1-x}$ films is described in *Thin Solid Films*, 55, pp. 229–234, 1978. A solid solution of $Ge_xSi_{1-x}$ was deposited at a substrate temperature between 800 and 1000 degrees C. The value of x varied uniformly through the layer thickness, from a value of 0.35 to a value of 0.95. Micrographs of the surface revealed numerous dislocations.

Growth of pure Ge films on Si substrates is described in *Applied Physics Letters*, 38, pp. 779–781, May 15, 1981, and *Applied Physics Letters*, 41, pp. 1070–1072, Dec. 1, 1982. The former paper reported smooth growth at substrate growth temperatures below 550 degrees C. and rough growth at higher temperatures. The latter paper reported epitaxial growth at temperatures within the range between 375 and 425 degrees C. Both papers were directed toward the preparation of materials for solar cells and, in both papers, the films reported had high dislocation densities.

SUMMARY OF THE INVENTION

We have found growth conditions for molecular beam epitaxy whereby epitaxial thin films of $Ge_xSi_{1-x}$ may be grown on silicon or germanium substrates for values of x within the range from 0.0 to 1.0. Relatively thick, smooth layers may be grown provided that the substrate temperature during deposition is within a critical range, the substrate is properly cleaned prior to growth and has a low dislocation density, and the vacuum is a pressure of $5 \times 10^{-8}$ Torr or less. The substrate temperature must be less than 550 degrees C. for values of x greater than 0.5. For smaller values of x, the growth temperature may be higher, and allowed substrate temperatures increase to a value of approximately 650 degrees C. for $0.0 \leq x \leq 0.5$.

Thus, at a given substrate temperature, thin alloy layers comprising $Ge_xSi_{1-x}$ grow in a smooth, two-dimensional manner when the value of x is less than a critical value, $x_c$. These combinations of growth temperature and composition define growth conditions which yield smooth, crack-free growth. For alloy compositions having values of x less than these critical values, excellent ion channeling is observed in layers grown at substrate temperatures between 550 and 750 degrees C. thus indicating low defect density.

For values of $x < 0.5$, both transmission electron microscopy and off-normal channeling measurements indicate that there are combinations of layer thickness and composition which permit elimination of misfit dislocations. For these combinations, the mismatch between the $Ge_xSi_{1-x}$ and the Si is accommodated by compressing the alloy layer in the plane of the layer so that the alloy assumes the Si lattice parameter. This strain accommodated growth is referred to as "pseudomorphic" or "commensurate". The combinations of alloy composition and thickness yielding pseudomorphic growth defined conditions yielding defect-free growth. Depending upon the precise value of x, pseudomorphic growth condition can be maintained for layer thicknesses up to 0.25 μm. This represents a critical layer thickness, $h_c$, beyond which dislocation-free material cannot be grown. The value of $h_c$ depends upon the layer composition, i.e., the value of x.

DETAILED DESCRIPTION

The $Ge_xSi_{1-x}$ layers are grown by molecular beam epitaxy on substrates, i.e., wafers, that comprise Si or Ge. The conductivity type of the wafer is not critical. For example, both n- and p-type Czochralski silicon wafers may be used. Our invention will be described by reference to growth on Si wafers that had a (100) substrate orientation and resistivities between 0.1 and 10.0 Ω-cm. Other orientations and resistivities may be used.

Prior to loading into the growth chamber, the wafers were precleaned by a series of degreasing, reducing and oxidizing solutions. The precleaned wafers were loaded into the molecular beam epitaxy apparatus for further cleaning. Details of the apparatus are known to those in the art and are described in the *Journal of Vacuum Science Technology*, 20, pp. 137–142, 1982. The apparatus will comprise both Ge and Si sources as well as sources for appropriate n- and p-type dopants. The cleaning step within the growth chamber is critical as it provides the clean surface needed for epitaxial growth. The clean surface, it is hypothesized, together with the high vacuum, makes it difficult for dislocations to form even though they may be energetically favored over dislocation-free strained layer growth. The wafers are cleaned by, for example, an argon ion sputtering followed by an anneal. The wafers may also be cleaned by heating. The wafer should be of high quality and have a relatively low, less than approximately $100/cm^2$, dislocation density.

A pure silicon layer is then typically deposited to provide a reproducible initial growth condition. This layer should have a quality that is comparable to that of the substrate. The shutter over the germanium source is then opened and growth of a $Ge_xSi_{1-x}$ layer begins. All layers are grown at a pressure of $5 \times 10^{-8}$ Torr or less to minimize the presence of impurities that might facilitate dislocation formation. The initial system pressure is approximately $2 \times 10^{-10}$ Torr, and the pressure rises during deposition. The background pressure, which is due almost entirely to hydrogen and helium, rises to a value between 5 and $50 \times 10^{-9}$ Torr. The deposition sources, i.e., the Ge and Si sources, are commercial electron beam evaporators, and the fluxes are separately sensed and controlled to yield an alloy deposition rate of approximately 5 Angstroms per second. The substrate temperature selection will be discussed later. After the desired $Ge_xSi_{1-x}$ layer or layers have been grown, a second Si layer is typically also grown.

Figure 1:
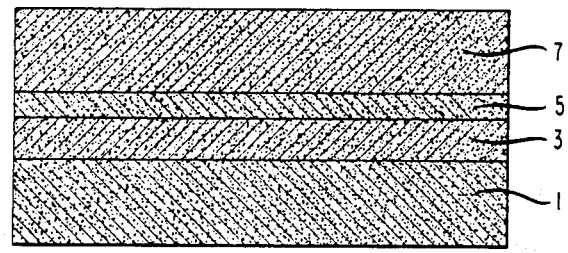
FIG. 1 is a cross-sectional view of a structure grown according to the method of this invention.

A cross-sectional view of a structure grown according to the method of this invention is shown in FIG. 1. For reasons of clarity and ease of explanation, the elements of the structure are not drawn to scale. The structure comprises silicon substrate 1, first silicon layer 3, alloy layer 5 comprising $Ge_xSi_{1-x}$, x greater than 0.0 and less than or equal to 1.0, and second silicon layer 7. It should be understood that layer 5 may comprise a plurality of $Ge_xSi_{1-x}$ layers. For example, the layers may have different values of x, or they may be interleaved with a plurality of Si layers. It is also to be understood that the substrate, as well as layers 3 and 7, may comprise Ge. If a Ge substrate is used, x is greater than or equal to 0.0 and less than 1.0.

At a given growth temperature, the alloy films grew in a smooth, two-dimensional manner as x increased from 0.0 to a critical value, $x_c$. When the critical value of x was exceeded, the films grew as discrete, three-dimensional nuclei. The transition between the two types of growth occurred relatively abruptly between x equal to $x_c$ and x approximately equal to $x_c+0.05$. As the value of x was further increased above the critical value, a relatively constant morphology was maintained and the nuclei did not display obvious facets but rather had a drop-like appearance which had been previously observed for silicon deposited by molecular beam epitaxy on sapphire substates. The term "two-dimensional" is used for growth of films of uniform thickness and a flat surface.

Figure 2:
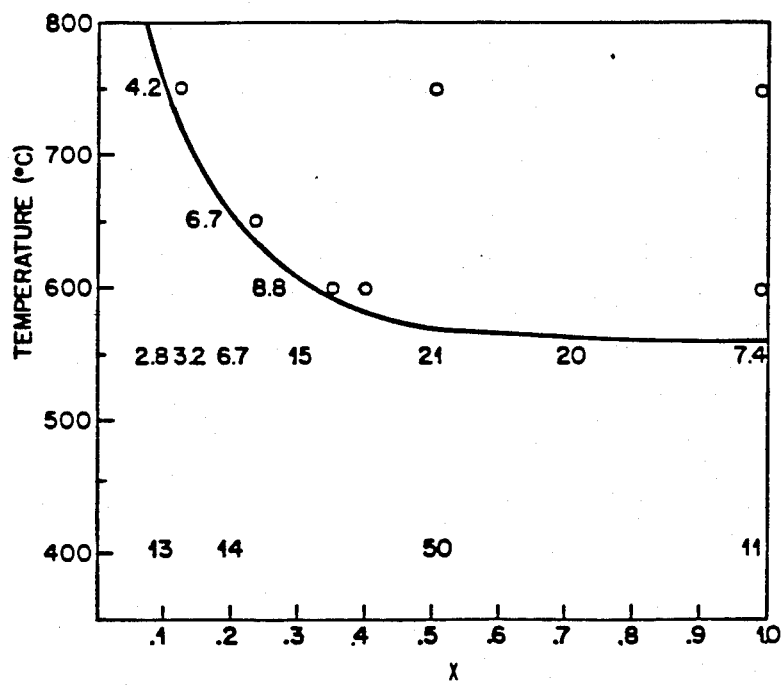
FIG. 2 plots the germanium fraction, x, in a $Ge_xSi_{1-x}$ layer horizontally versus the substrate growth temperature in units the degrees C. vertically and defines conditions for smooth growth.

FIG. 2 plots the germanium fraction, x, horizontally in a 1000 Angstrom thick $Ge_xSi_{1-x}$ layer, grown on a Si layer over a Si substrate, versus the substrate growth temperature in degrees C., vertically. For temperatures and germanium fractions below the solid line, two-dimensional growth was obtained while three-dimensional growth, that is, islands, was obtained above the line. The circles indicate rough growth while the numbers are the $y_{chan}/y_{rand}$ ratios which are explained below. It can be seen that for any substrate temperature, epitaxial growth is obtained up to a critical value of $x_c$. Above the critical value, islands are grown. The critical value of x increases as the substrate temperature is lowered and reaches a value of 1.0 for substrate temperatures below 550 degrees C., i.e., at substrate temperatures below 550 degrees C., all compositions grow smoothly. Growth should be at a substrate temperature such that the particles in the molecular beam have mobility such that islands do not grow.

If the increase in $x_c$ were due to a reduction in atomic surface mobility, it might be expected that crystal quality would degrade. The crystallinity of the films was investigated by both Rutherford backscattering and channeling. The ratio of the [100] channeling to non-aligned backscattering yields from the germanium was used as a definition of $y_{chan}/y_{rand}$. It is well known that as crystalline perfection increases, channeling improves and the ratio of $y_{chan}/y_{rand}$ decreases from a value of 100 percent for completely disordered material to a value of approximately 3 percent in a perfect crystalline semiconductor. The numbers in FIG. 2 are the numerical values of $y_{chan}/y_{rand}$ and, as is evident, a high-quality crystalline $Ge_xSi_{1-x}$ layer is obtained over wide ranges of both compositions and substrate deposition temperatures.

At a substrate temperature of 550 degrees C., all alloy compositions grow smoothly. At both 400 and 550 degree C. substrate temperatures, $y_{chan}/y_{rand}$ values increased sharply between values of $x=0.2$ and $x=0.5$ for 1000 Angstrom thick films. In an attempt to understand and explain this increase, $Ge_xSi_{1-x}$ layers having values of x between 0.1 and 1.0 were examined in cross section by transmission electron microscopy, and it was observed that the alloy dislocation density did not increase linearly with the germanium fraction as might be expected on the basis of lattice mismatch. There was an absence of dislocations in the $x=0.1$ and $x=0.2$ films, and the number of dislocations increased only gradually for larger values of x. This shows that the lattice mismatch in the $x=0.1$ and 0.2 films is accommodated by strain, i.e., the alloy film is compressed laterally to match the silicon lattice constant.

If pseudomorphic or strain accommodated alloy growth is taking place, it would be expected that the quality of the layers would also depend on the film thickness and thinner films would have a lower accumulated strain energy and less of a driving force for dislocation formation. This hypothesis was tested by growing $Ge_xSi_{1-x}$ layers of various thicknesses embedded between two silicon layers. If an alloy layer were thin enough, the alloy layer should grow without dislocations for values of $x \geq 0.5$. It was found that for sufficiently thin alloy dislocations were detected. We found accommodation of misfit through strain through layer thicknesses as great as 2500 Angstroms for values of $x=0.2$. This is surprisingly as the thicknesses of these layers are substantially greater than would expected from an equilibrium analysis of both strain energy and dislocation formation.

Commensurate film growth yields a film free of dislocations with the misfit absorbed by tetragonal distortion. Ion channeling spectra along off-normal channeling directions showed evidence for the tetragonal distortion as a large dechanneling rate in the substrate with the beam aligned in the film. The off-normal <110> and <111> axes make angles, $\theta$, with respect to the [100] normal that are smaller than for the case of cubic symmetry. The difference, $\Delta\theta$, is related to the tetragonal distortion, $\epsilon_T$ by $$\epsilon_T = \frac{b_\perp - b_{11}}{b_{11}} = \frac{-\Delta\theta}{\sin\theta\cos\theta} \qquad (1)$$

where b and b are the normal and in-plane lattice constants, respectively.

Figure 3:
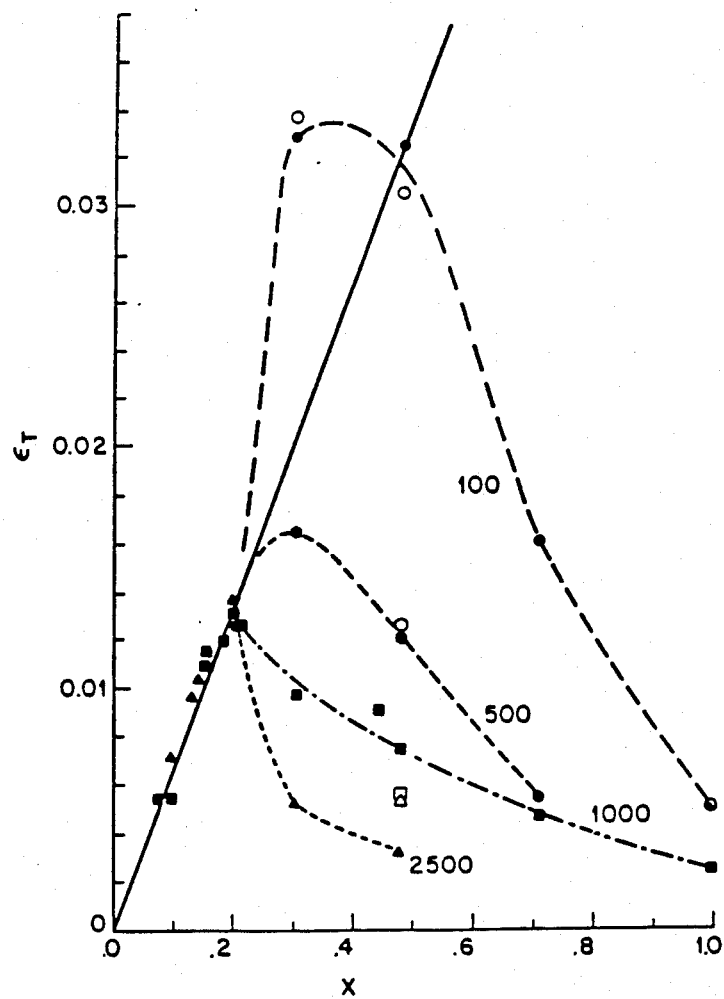
FIG. 3 plots the germanium fraction in a $Ge_xSi_{1-x}$ layer horizontally in units of x versus the tetragonal distortion $\epsilon_t$ vertically.
Figure 4:
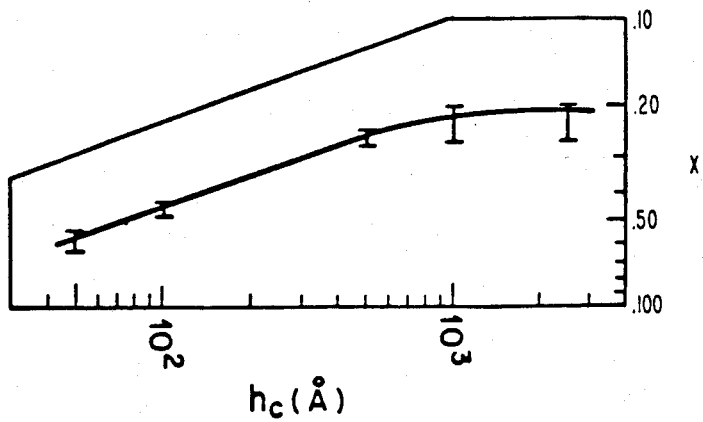
FIG. 4 plots the germanium concentration in units of x in a $Ge_xSi_{1-x}$ layer horizontally versus the critical thickness in units of Angstroms vertically and defines conditions for defect-free growth.

FIG. 3 plots the germanium fraction horizontally versus the tetragonal distortion vertically. The filled and open symbols represent values obtained by ion channeling and x-ray analysis, respectively. The layer thicknesses are shown for each curve in units of Angstroms. The solid line represents a theoretical dependence based on exact in-plane registry in the epilayer, i.e., $b_\parallel = a$, where a is the silicon lattice constant, from which it can be shown that $$\epsilon_T = \left(\frac{1+\nu}{1-\nu}\right)f \qquad (2)$$

where $\nu$ is Poisson's ratio and $f=(b-a)/a$, b is the bulk or relaxed $Ge_xSi_{1-x}$ lattice constant. As is evident, the points in FIG. 3 depart from the straight line as the Ge concentration increases. Thinner layer can be grown with greater Ge fractions as the misfit is accompanied by increased tetragonal distortion. However, a point is reached at which the distortion cannot accommodate all of the strain, and the straight line can no longer be followed. This represents a critical film thickness, $h_c$, for defect-free growth. The thicknesses, $h_c$, are shown in FIG. 4 for several values of x.

The thicknesses are considerably greater than those predicted by model strain and misfit dislocation energies. This might also be termed a "mechanical stability model." We hypothesize that there are barriers to the nucleation and transport of enough misfit dislocations to significantly relax the tetragonal strain in the commensurate heterostructures.

One possible nucleation barrier may be calculated by considering shear displacements of the epilayer with respect to the substrate. The average interfacial energy at the critical thickness may be estimated as $\mu c^2/4\pi^2 d$, where $\mu$ is the shear modulus, c the slip distance, and d the interplanar spacing. Equating this to the coherency-strain energy, $2(1+\nu)\mu f^2 h_c/(1-\nu)$, and taking $d=a/4$ and $c=a/\sqrt{2}$, gives the result $h_c \approx 0.014\, af^{-2}$. This estimate accounts for our observation in the vicinity of $x=0.25$, where it predicts $h_c=900$ Angstroms, although the dependence in FIG. 3 is faster than $f^{-2}$. We conclude that the strong interfacial bond is important for a large $h_c$, but is not the entire explanation.

Other structures may be grown. For example, a selectively doped heterostructure transistor having a heavily doped wide bandgap material and a normally undoped alloy may be grown. Free carriers generated in the wider bandgap materials would then fall into the narrower bandgap alloy layers. The alloy layer should exhibit higher mobility because there are no ionized impurities and the alloy material has higher mobility. Also, a thin Si layer may be grown on a $Ge_xSi_{1-x}$ layer and then oxidized forming a Ge MOSFET. Furthermore, as previously mentioned, the alloy layers may be grown on a Ge substrate.

What is claimed is:

1. A structure comprising a substrate consisting of material selected from the group consisting of Ge and Si and disposed on said substrate, at least one pseudomorphic layer comprising $Ge_xSi_{1-x}$, x greater than 0.0 and less than or equal to 1.0 when said substrate is Si, and x greater than or equal to 0.0 and less than 1.0 when said substrate is Ge, said at least one pseudomorphic layer having a thickness approximately equal to $h_c$ where $h_c$ is approximately equal to $0.014\, af^{-2}$, a is the silicon lattice constant and $f=(b-a)/a$ where b is the bulk $Ge_xSi_{1-x}$ lattice constant.

2. A structure as recited in claim 11 in which said substrate comprises Si.

3. A structure as recited in claim 2 further comprising a layer of Si between said substrate and said $Ge_xSi_{1-x}$ layer.

4. A structure as recited in claim 3 further comprising a layer of Si on said $Ge_xSi_{1-x}$ layer.

5. A structure as recited in claim 4 in which at least one of said Si layers is doped.

6. A structure as recited in claim 1 comprising a plurality of $Ge_xSi_{1-x}$ layers.

7. A structure as recited in claim 6 further comprising a layer of Si on said plurality of $Ge_xSi_{1-x}$ layers.

8. A structure as recited in claim 7 in which said Si layer is oxidized.

9. A structure as recited in claim 1 in which said substrate comprises Ge.

10. A structure as recited in claim 9 further comprising a layer of Si, said layer contacting said $Ge_xSi_{1-x}$ layer.

11. A structure as recited in claim 10 in which at least a portion of said Si layer is oxidized.

12. A structure as recited in claim 10 in which said Si layer is oxidized.

* * * * *